United States Patent
Lanzone (10) Patent No.: US 8,969,192 B1
(45) Date of Patent: Mar. 3, 2015

(54) LOW STRESS SUBSTRATE AND FORMATION METHOD

(75) Inventor: Robert Lanzone, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 1083 days.

(21) Appl. No.: 12/913,376

(22) Filed: Oct. 27, 2010

(51) Int. Cl.
*H01L 21/44* (2006.01)

(52) U.S. Cl.
USPC ............ 438/614; 438/612; 438/613

(58) Field of Classification Search
USPC ........................... 438/612, 613, 614
See application file for complete search history.

(56) References Cited

U.S. PATENT DOCUMENTS

2007/0029669 A1* 2/2007 Stepniak et al. .............. 257/734
2009/0215206 A1* 8/2009 Singhal et al. .................. 438/17

OTHER PUBLICATIONS

Toho Technology Corporation, "FLX-2320-S Stress Measurement System Overview", 2007, 1 page [online]. Retrieved on Aug. 17, 2010 from the Internet: <URL:http//www.tohotechnology.com/flx.html>.

* cited by examiner

*Primary Examiner* — Ha Tran T Nguyen
*Assistant Examiner* — Aaron Dehne
(74) *Attorney, Agent, or Firm* — McAndrews, Held & Malloy (57) ABSTRACT

A bumped substrate is optimized to be flat post reflow. By producing the bumped substrate to be flat post reflow, device reliability is assured. More particularly, the transistor shift associated with warped substrates is avoided. Further, by producing a flat bumped substrate post reflow, reliability in the flip chip interconnections is assured as compared to the undesirable open circuits associated with warped substrates.

22 Claims, 5 Drawing Sheets

Low stress bumped substrate formation method 100

FIG. 1

Low stress bumped substrate formation method 100

LOW STRESS SUBSTRATE AND FORMATION METHOD

TECHNICAL FIELD

The present application relates to the field of electronics, and more particularly, to methods of forming electronic component structures and the related structures.

BACKGROUND

A wafer level bumping process involves the formation of electrically conductive bumps upon terminals of electronic components while still in wafer form. Subsequently, the bumps are use to form electrical interconnections with the electronic components.

If the wafer is warped, unevenness in the height of the bumps is created. This unevenness can cause open circuits and thus reworking or scrapping of the assemblies formed with the electronic components. Accordingly, it is desirable that the wafer is flat such that the bumps lie in a common plane to ensure that reliable electrical interconnections are formed with the bumps.

BRIEF DESCRIPTION OF THE DRAWINGS

In the following description, the same or similar elements are labeled with the same or similar reference numbers.

DETAILED DESCRIPTION

Figure 1:
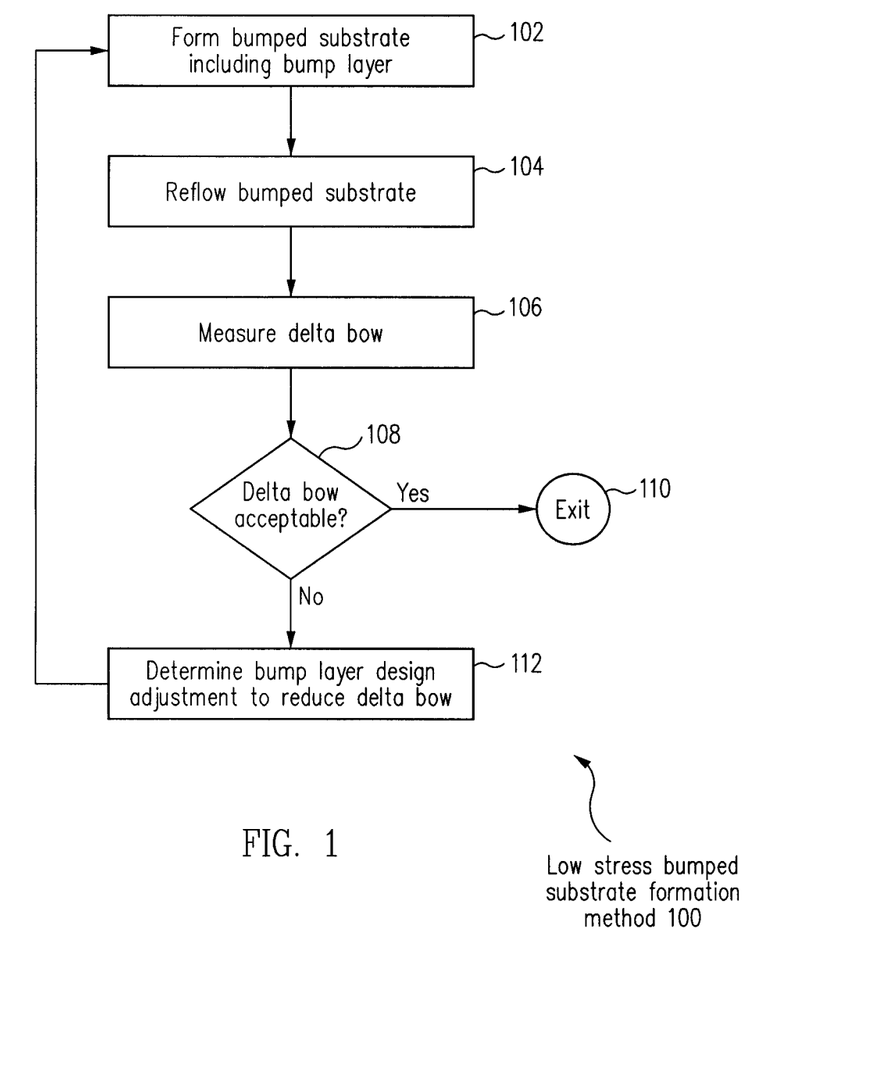
FIG. 1 is a flow diagram of a low stress bumped substrate formation method in accordance with one embodiment.

As an overview, referring to FIG. 1, the design of a bumped substrate is optimized to eliminate warpage in the bumped substrate post reflow in a determine bump layer design adjustment to reduce delta bow operation 112. The optimized design of the bumped substrate is then characterized by: (1) forming the bumped substrate in a form bumped substrate including bump layer operation 102; (2) ref lowing the bumped substrate in a reflow bumped substrate operation 104; (3) measuring the delta bow of the bumped substrate post reflow in a measure delta bow operation 106; and (4) determining whether the delta bow is acceptable, e.g., the bumped substrate is flat, in a delta bow acceptable check operation 108. The delta bow is a measure of the warpage of the bumped substrate post reflow.

If a determination is made that the optimization is not sufficient, i.e., a determination is made that the delta bow is not acceptable in delta bow acceptable check operation 108, the design is further optimized and characterized by repeating the above operations. This process is repeated until a determination is made that the optimization is sufficient, i.e., a determination is made that the delta bow is acceptable in delta bow acceptable check operation 108. The design of the final optimized bumped substrate is then used to mass produce the bumped substrates.

By producing the bumped substrates with an acceptable delta bow post reflow, device reliability is assured. More particularly, the transistor shift associated with warped substrates is avoided. Further, by producing flat bumped substrates, reliability in the flip chip interconnections is assured as compared to the undesirable open circuits associated with warped substrates.

As set forth above, the delta bow of the bumped substrate is measured post reflow. More particularly, the inventor has discovered that the greatest contribution to the delta bow is the reflow operation, i.e., the change in stress of the various layers of the bumped substrate before and after reflow. Accordingly, the bumped substrate is designed to have an acceptable delta bow post reflow.

Figure 2:
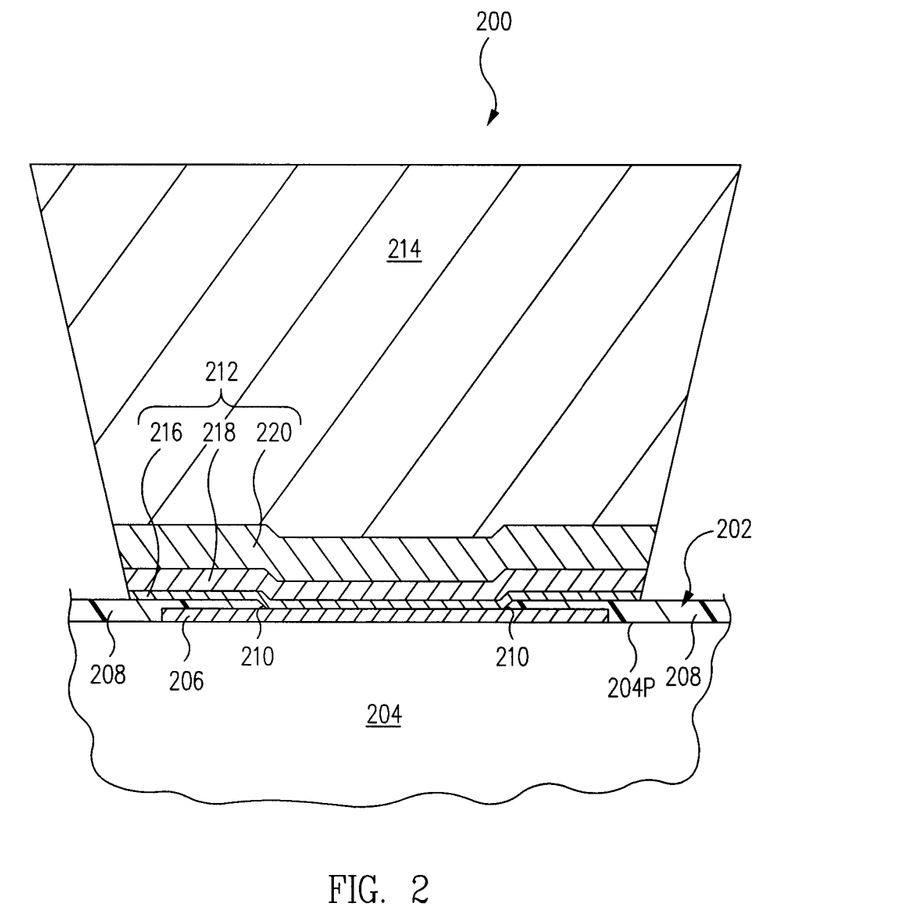
FIG. 2 is a cross-sectional view of a bumped substrate in accordance with one embodiment.

Now in more detail, FIG. 1 is a flow diagram of a low stress bumped substrate formation method 100 in accordance with one embodiment. FIG. 2 is a cross-sectional view of a bumped substrate 200 in accordance with one embodiment. Referring now to FIGS. 1 and 2 together, in a form bumped substrate including bump layer operation 102, bumped substrate 200 is formed.

Bumped substrate 200 includes a base substrate 202, e.g., a silicon wafer including a plurality of electronic components integrally connected together. Illustratively, base substrate 202 is a wafer including an array of integrated circuit dies although includes other electronic components in other embodiments.

Base substrate 202 includes a base substrate body 204 having a principal surface 204P. In one example, base substrate body 204 is the silicon bulk of the wafer in which the electronic devices, e.g., transistors, are formed. In one embodiment, base substrate 202 further includes dielectric layers and rerouting layers that redistribute the device input/output (I/O) of the electronic devices formed within base substrate body 204 to bond pads 206 as those of skill in the art will understand in light of this disclosure.

Bond pads 206 of base substrate 202 are formed on principal surface 204P of base substrate body 204. Illustratively, bond pads 206 are formed of aluminum although are formed of other electrically conductive materials in other embodiments.

Base substrate 202 further includes a passivation layer 208. Passivation layer 208, e.g., silicon nitride or other dielectric material, covers and protects principal surface 204P of base substrate body 204.

Passivation layer 208 includes passivation layer openings 210 that expose bond pads 206. Generally, passivation layer openings 210 are slightly smaller than bond pads 206 such that the outer periphery of bond pads 206 are covered by passivation layer 208.

As set forth above, base substrate 202 includes base substrate body 204, bond pads 206, and passivation layer 208 patterned to expose bond pads 206 through passivation layer openings 210. Base substrate 202 is typical of a silicon wafer provided from a silicon wafer manufacturer and thus is not described further to avoid detracting from the principles of this embodiment.

Bumped substrate 200 further includes bump layers 212 and interconnection bumps 214. In FIG. 2 and the subsequent discussion, only a single bond pad 206, a single passivation layer opening 210, a single bump layer 212, and a single interconnection bump 214 are set forth for purposes of simplicity. However, it is to be understood that bumped substrate 200 includes a plurality of bond pads 206, passivation layer openings 210, bump layers 212, and interconnection bumps 214.

Bump layer 212 forms an interface between bond pad 206 and interconnection bump 214. More particularly, bump layer 212 physically and electrically connects interconnection bump 214 to bond pad 206. Bump layer 212 is sometimes called an Under Bump Metallization (UBM).

Bump layer 212 provides a strong, stable, low resistance electrical connection between interconnection bump 214, e.g., solder, and bond pad 206, e.g., aluminum. Bump layer 212 adheres well to both bond pad 206 and passivation layer 208, hermetically sealing bond pad 206 from the environment. Further, bump layer 212 provides a strong barrier to prevent the diffusion of materials between interconnection bump 214, bond pad 206 and bump layer 212. Further still, bump layer 212 is readily wettable by interconnection bump 214, e.g., for solder reflow.

Generally, bump layer 212 includes at least a single layer. In accordance with this particular embodiment, bump layer 212 includes a lower, e.g., first, layer 216, a middle, e.g., second, layer 218, and an upper, e.g., third, layer 220. Bump layer 212 is sometimes called a UBM stack.

Lower layer 216 is formed directly on bond pad 206 and extends on to passivation layer 208 around the periphery of passivation layer opening 210. In accordance with this embodiment, lower layer 216 is an adhesion layer that has good adhesion to both bond pad 206 and passivation layer 208 and seals bond pad 206 from the environment. In particular embodiments, lower layer 216 is formed of sputtered titanium tungsten (TiW) or titanium (Ti).

Middle layer 218 is formed directly on lower layer 216. In accordance with this embodiment, middle layer 218 serves as a current carrying layer. In one particular embodiment, middle layer 218 is formed of sputtered and then electroplated copper (Cu).

Upper layer 220 is formed directly on middle layer 218. In accordance with this embodiment, upper layer 220 is a solder wettable layer that is readily wettable by interconnection bump 214, e.g., solder. Further, upper layer 220 is a diffusion barrier layer that prevents diffusion of materials through upper layer 220. In one particular embodiment, upper layer 220 is formed of plated, e.g., electroplated, nickel (Ni).

Interconnection bump 214 is formed directly on upper layer 220. In one embodiment, interconnection bump 214 is formed of solder, e.g., tin silver (SnAg) solder, although is formed of other electrically conductive materials in other embodiments.

Referring still to FIGS. 1 and 2 together, in one embodiment, in form bumped substrate including bump layer operation 102, base substrate 202 including bond pad 206 and passivation layer 208 having passivation layer opening 210 formed therein is provided. Lower layer 216, e.g., titanium tungsten (TiW), and middle layer 218, e.g., copper (Cu), are blanket (nonselectively) deposited, e.g., by sputtering and/or plating.

After formation of lower layer 216 and middle layer 218, a patterned photoresist is formed on middle layer 218. The patterned photoresist includes an opening therein that exposes a portion of middle layer 218 above bond pad 206.

Upper layer 220, e.g., nickel, is formed, e.g., by plating, on middle layer 218 and within the opening of the patterned photoresist. Interconnection bump 214, e.g., solder, is then plated on upper layer 220 and within the opening of the patterned photoresist.

The patterned photoresist is then stripped to expose middle layer 218 except where middle layer 218 is covered by upper layer 220 and interconnection bump 214. The exposed portion of middle layer 218 including the underlying lower layer 216 is then removed, e.g., by etching, using upper layer 220 and interconnection bump 214 as a mask resulting in bumped substrate 200 as illustrated in FIG. 2.

Figure 3:
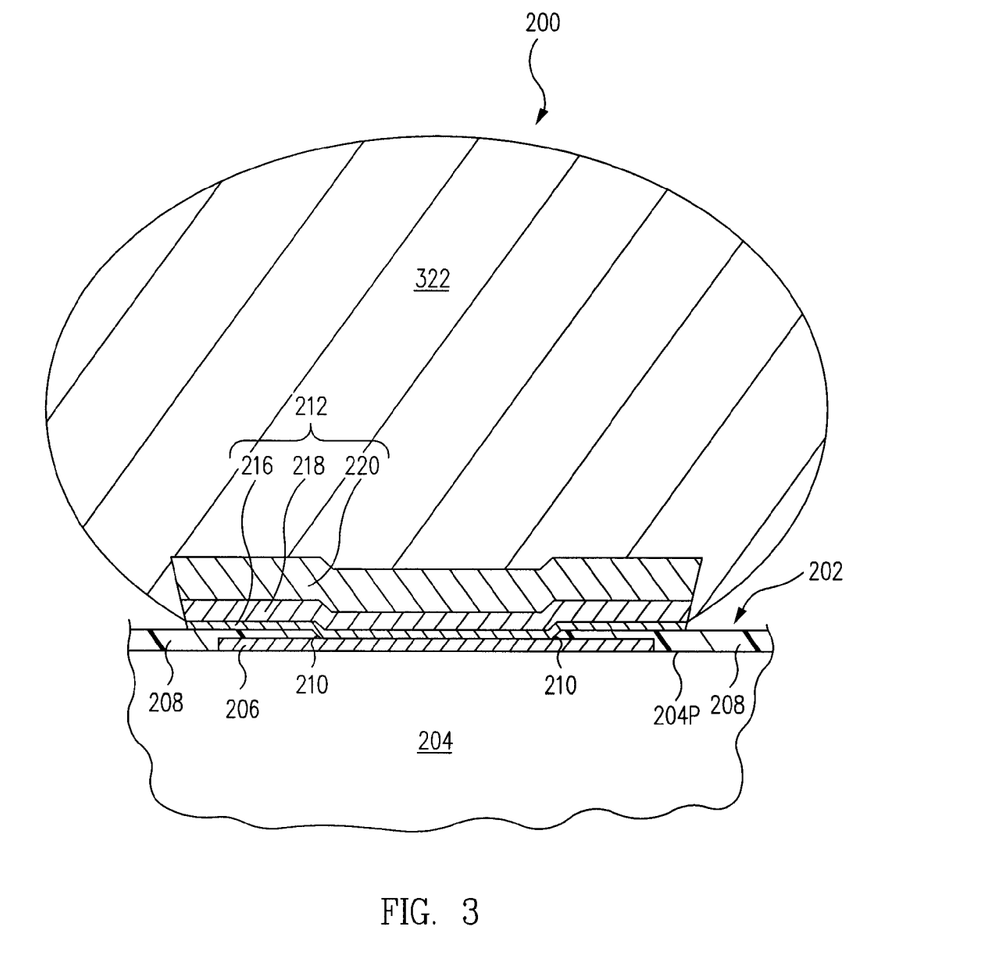
FIG. 3 is a cross-sectional view of the bump substrate of FIG. 2 after performance of a reflow bumped substrate operation in accordance with one embodiment.

From form bumped substrate including bump layer operation 102, flow moves to a reflow bumped substrate operation 104. In reflow bump substrate operation 104, bumped substrate 200 is ref lowed, i.e., heated to above the melting temperature of interconnection bump 214 and then cooled, resulting in bumped substrate 200 as illustrated in FIG. 3. Generally in reflow bumped substrate operation 104, bumped substrate 200 is reflowed.

More particularly, FIG. 3 is a cross-sectional view of bumped substrate 200 of FIG. 2 after performance of reflow bumped substrate operation 104 in accordance with one embodiment. Referring now to FIGS. 1, 2 and 3 together, performance of reflow bumped substrate operation 104 causes interconnection bump 214 of FIG. 2 to reflow and form interconnection ball 322 as illustrated in FIG. 3. More particularly, performance of reflow bumped substrate operation 104, sometimes called reflow, causes the substantially cylindrical interconnection bump 214 as illustrated in FIG. 2 to melt and resolidify to the substantially spherical interconnection ball 322 as illustrated in FIG. 3.

Generally, interconnection ball 322 provides the electrically conductive structure to which other electronic components are physically and electrically connected. For example, interconnection ball 322 is reflowed, i.e., heated to a melt and resolidified, to join a terminal of another electronic component to bumped substrate 200.

From reflow bumped substrate operation 104, flow moves to a measure delta bow operation 106. In measure delta bow operation 106, the delta bow is measured. In one embodiment, the delta bow is the curvature, sometimes called warpage, of bumped substrate 200 after performance of reflow bumped substrate operation 104 relative to a hypothetical flat plane. More particularly, the delta bow is the total curvature of bumped substrate 200 after reflow.

The delta bow is measured using any one of a number of techniques well known to those of skill in the art. In one particular embodiment, the delta bow is measured using the FLX-2320-S Stress Measurement System available from Toho Technology Corporation.

Figure 4:
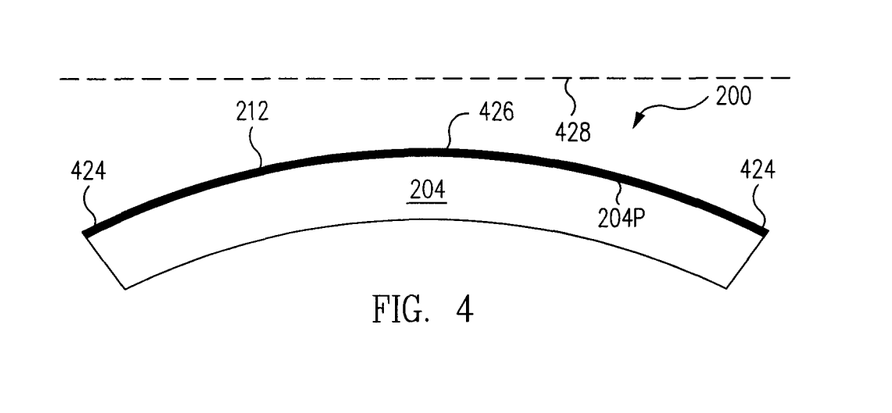
FIG. 4 is a general cross-sectional view of the bumped substrate of FIG. 3 with a compressive bow in accordance with one embodiment.

FIG. 4 is a general cross-sectional view of bumped substrate 200 of FIG. 3 with a compressive bow in accordance with one embodiment. As FIG. 4 is a generalized view of the entire bumped substrate 200, the specific features of bumped substrate 200 are not illustrated. For simplicity, only base substrate body 204 and bump layer 212 are illustrated. As illustrated, bump layer 212 is above base substrate body 204.

Referring now to FIGS. 1, 2, 3, and 4 together, after performance of reflow bumped substrate operation 104, bumped substrate 200 is curved to have a compressive bow. More particularly, after reflow, bump layer 212 is under tensile stress, i.e., bump layer 212 wants to be larger than base substrate body 204. More particularly, tensile stress is internal stress of bump layer 212 that wants to make bump layer 212 larger. Stated another way, tensile stress is outward stress that acts towards the outer periphery 424 of bumped substrate 200.

However, base substrate body 204 is under compressive stress, i.e., base substrate body 204 wants to be smaller than bump layer 212. More particularly, compressive stress is internal stress of base substrate body 204 that wants to make base substrate body 204 smaller. Stated another way, compressive stress is inward stress that acts towards the center 426 of bumped substrate 200.

More particularly, bump layer 212 is effectively pushing down on outer periphery 424 of bumped substrate 200 relative to center 426 of bumped substrate 200. Substrate body 204 has an opposite stress, i.e., compressive stress, to the tensile stress of bump layer 212. Substrate body 204 resists the pushing down by bump layer 212 on outer periphery 424 of bumped substrate 200 relative to center 426. More particularly, the internal compressive stress of base substrate body 204 pushes up on outer periphery 424 of bumped substrate 200 relative to center 426 of bumped substrate.

When bumped substrate 200 is under compressive stress as illustrated in FIG. 4, bumped substrate 200 is sometimes said to be in a cry configuration. Bumped substrate 200 is curved relative to a hypothetical flat plane 428. More particularly, outer periphery 424 is bent down below center 426. When viewed from the direction of bump layer 212, i.e., from above in the view of FIG. 4, bumped substrate 200 is bent in the convex direction, i.e., is convex.

Figure 5:
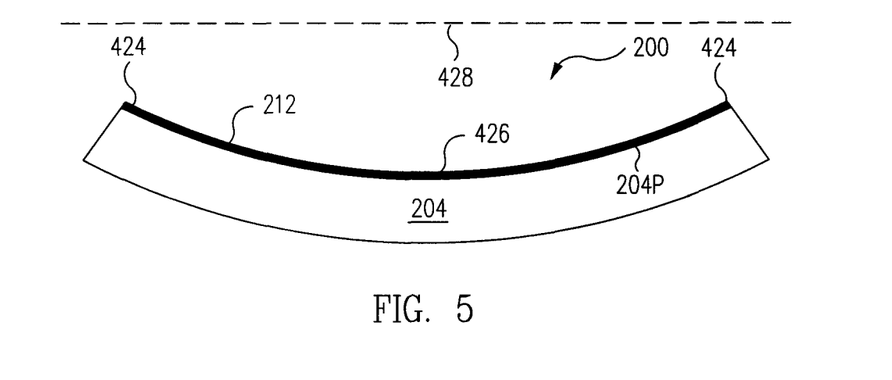
FIG. 5 is a general cross-sectional view of the bumped substrate of FIG. 3 with a tensile bow in accordance with one embodiment.

FIG. 5 is a general cross-sectional view of bumped substrate 200 of FIG. 3 with a tensile bow in accordance with one embodiment. As FIG. 5 is a generalized view of the entire bumped substrate 200, the specific features of bumped substrate 200 are not illustrated. For simplicity, only base substrate body 204 and bump layer 212 are illustrated. As illustrated, bump layer 212 is above base substrate body 204.

Referring now to FIGS. 1, 2, 3, and 5 together, after performance of reflow bumped substrate operation 104, bumped substrate 200 is curved to have a tensile bow. More particularly, after reflow, bump layer 212 is under compressive stress, i.e., bump layer 212 wants to be smaller than base substrate body 204. More particularly, compressive stress is internal stress of bump layer 212 that wants to make bump layer 212 smaller. Stated another way, compressive stress is inward stress that acts towards center 426 of bumped substrate 200.

However, base substrate body 204 is under tensile stress, i.e., base substrate body 204 wants to be larger than bump layer 212. More particularly, tensile stress is internal stress of base substrate body 204 that wants to make base substrate body 204 larger. Stated another way, tensile stress is outward stress that acts towards outer periphery 424 of bumped substrate 200.

More particularly, bump layer 212 is effectively pulling up on outer periphery 424 of bumped substrate 200 relative to center 426 of bumped substrate 200. Substrate body 204 has an opposite stress, i.e., tensile stress, to the compressive stress of bump layer 212. Substrate body 204 resists the pulling up by bump layer 212 on outer periphery 424 of bumped substrate 200 relative to center 426. More particularly, the internal tensile stress of base substrate body 204 pushes down on outer periphery 424 of bumped substrate 200 relative to center 426 of bumped substrate.

When bumped substrate 200 is under tensile stress as illustrated in FIG. 5, bumped substrate 200 is sometimes said to be in a smile configuration. Bumped substrate 200 is curved relative to hypothetical flat plane 428. More particularly, outer periphery 424 is bent up above center 426. When viewed from the direction of bump layer 212, i.e., from above in the view of FIG. 5, bumped substrate 200 is bent in the concave direction, i.e., is concave.

Figure 6:
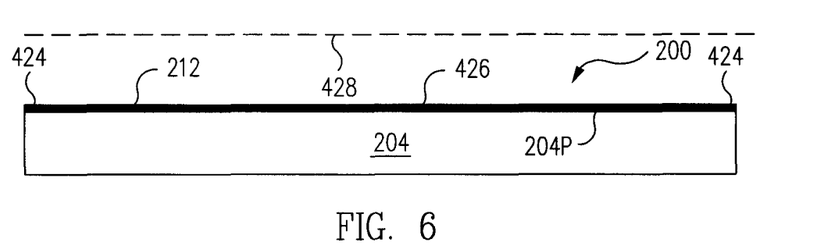
FIG. 6 is a general cross-sectional view of the bumped substrate of FIG. 3 with a zero bow in accordance with one embodiment.

FIG. 6 is a general cross-sectional view of bumped substrate 200 of FIG. 3 with a zero bow in accordance with one embodiment. As FIG. 6 is a generalized view of the entire bumped substrate 200, the specific features of bumped substrate 200 are not illustrated. For simplicity, only base substrate body 204 and bump layer 212 are illustrated. As illustrated, bump layer 212 is above base substrate body 204.

Referring now to FIGS. 1, 2, 3, and 6 together, after performance of reflow bumped substrate operation 104, bumped substrate 200 is flat, sometimes called planar, i.e., has a zero bow. A zero bow means an absence of curvature, but also includes a slight curvature to within accepted manufacturing tolerance. In one embodiment, a bow: (1) less than 50 μm for a 150 mm wafer; (2) less than or equal to 50 μm for a 200 mm wafer; and (3) less than 100 μm for a 300 mm wafer, is considered zero bow although an acceptable zero bow can have more or less curvature in other embodiments depending upon the application.

At zero bow, bumped substrate 200 is under zero or very low stress. More particularly, any stress, compressive or tensile, of bump layer 212 is offset by stress, tensile or compressive, respectively, of base substrate body 204. Generally, the net stress of the layers of bumped substrate 200 is zero or very low.

As illustrated in FIG. 6, bumped substrate 200 is parallel to hypothetical flat plane 428. More particularly, outer periphery 424 and center 426 lie in a common plane. When viewed from the direction of bump layer 212, i.e., from above in the view of FIG. 6, bumped substrate 200 is a flat plane.

Referring now to FIGS. 1, 4, 5, and 6 together, from measure delta bow operation 106, flow moves to a delta bow acceptable check operation 108. In delta bow acceptable check operation 108, a determination is made as to whether the measured delta bow is acceptable. Recall that the delta bow was measured in measure delta bow operation 106.

If the delta bow is acceptable, flow moves from delta bow acceptable check operation 108 and exits at an exit operation 110. For example, if the delta bow is zero resulting in a planar bumped substrate 200 such as that illustrated in FIG. 6, no bump layer adjustments are necessary and flow exits at exit operation 110.

Conversely, if a determination is made that the delta bow is not acceptable, flow moves from delta bow acceptable check operation 108 to a determine bump layer design adjustment to reduce delta bow operation 112.

In determine bump layer design adjustment to reduce delta bow operation 112, the adjustment to the design of the bump layer 212 to reduce the delta bow after reflow is determined. To be clear, the adjustment is to the design of the bump layer 212 to be used for subsequent production of the bump layer 212, and not to the actual bump layer 212 of bumped substrate 200 for which the delta bow was measured in measure delta bow operation 106. Typically, the bumped substrate 200 for which the delta bow was measured in measure delta bow operation 106 is saved or discarded.

For example, if substrate 200 has a compressive bow such as that illustrated in FIG. 4, a determination is made that bump layer 212 must have less tensile stress after reflow to flatten bumped substrate 200. Less tensile stress includes zero stress and even compressive stress. For example, to counteract the compressive bow of bumped substrate 200, bump layer 212 is adjusted to have a compressive stress post reflow to flatten bumped substrate 200.

Bump layer 212 is adjusted to have less tensile stress post reflow using different techniques in different embodiments. In one embodiment, bump layer 212 is formed of the identical layer(s) having the identical thicknesses. However, formation parameters of bump layer 212, e.g., the UBM deposition processes themselves, are adjusted to reduce the tensile stress of bump layer 212. For example, one or more of the plating bath temperature, the plating rate, the plating bath metal content, the plating bath pH, and the plating bath additive concentrations are adjusted to reduce the tensile stress of bump layer 212 as those of skill in the art will understand in light of this disclosure. In one particular example, the formation parameters of a plated nickel layer of bump layer 212, e.g., of upper layer 220, are adjusted to form the nickel layer, and thus bump layer 212, to have less tensile stress post reflow.

In another embodiment, bump layer 212 is formed of the identical layer(s) but the thickness of one or more of the layers is adjusted to reduce the tensile stress of bump layer 212

In yet another embodiment, bump layer 212 is formed with more or less layers. Illustratively, an additional layer is added to or eliminated from bump layer 212 to reduce the tensile stress of bump layer 212.

In another example, if substrate 200 has a tensile bow such as that illustrated in FIG. 5, a determination is made that bump layer 212 must have less compressive stress after reflow to flatten bumped substrate 200. Less compressive stress includes zero stress and even tensile stress. For example, to counteract the tensile bow of bumped substrate 200, bump layer 212 is adjusted to have a tensile stress post reflow to flatten bumped substrate 200.

Bump layer 212 is adjusted to have less compressive stress using different techniques in different embodiments. In one embodiment, bump layer 212 is formed of the identical layer(s) having the identical thicknesses. However, formation parameters of bump layer 212, e.g., the UBM deposition processes themselves, are adjusted to reduce the compressive stress of bump layer 212. For example, one or more of the plating bath temperature, the plating rate, the plating bath metal content, the plating bath pH, and the plating bath additive concentrations are adjusted to reduce the compressive stress of bump layer 212 as those of skill in the art will understand in light of this disclosure. In one particular example, the formation parameters of a plated nickel layer of bump layer 212, e.g., of upper layer 220, are adjusted to form the nickel layer, and thus bump layer 212, to have less compressive stress post reflow.

In another embodiment, bump layer 212 is formed of the identical layer(s) but the thicknesses of one or more of the layers is adjusted to reduce the compressive stress of bump layer 212

In yet another embodiment, bump layer 212 is formed with more or less layers. Illustratively, an additional layer is added to or eliminated from bump layer 212 to reduce the compressive stress of bump layer 212.

From determine bump layer design adjustment to reduce delta bow operation 112, flow returns to form bumped substrate including bump layer operation 102. In form bumped substrate including bump layer operation 102, a new bumped substrate 200 is again formed but with the adjusted bump layer 212.

More particularly, the new bumped substrate 200, hereinafter referred to as an adjusted bump layer bumped substrate 200, is formed. To clarify, a new adjusted bump layer bumped substrate 200 is formed with the adjusted bump layer 212. This new adjusted bump layer bumped substrate 200 is different than the earlier bumped substrate 200 upon which operations 104, 106, 108 were performed. For example, after performance of measure delta bow operation 106, the earlier bumped substrate 200 is saved or discarded.

Reflow bumped substrate operation 104, measured delta bow operation 106, and delta bow acceptable check operation 108 are repeated on the adjusted bump layer bumped substrate 200.

If a determination is made that the delta bow is acceptable in delta bow acceptable check operation 108, flow moves to and exits at exit operation 110. Conversely, if the delta bow is still unacceptable, flow returns to determine bump layer design adjustment to reduce delta bow operation 112, and bump layer 212 is further adjusted to reduce the delta bow after reflow to an acceptable level. Generally, operations 112, 102, 104, 106, and 108 are repeated until a determination is made that the delta bow is acceptable in delta bow acceptable check operation 108, and flow moves to and exits at exit operation 110.

To summarize, the design of a bumped substrate 200 is optimized in determine bump layer design adjustment to reduce delta bow operation 112. The optimized design of the bumped substrate 200 is characterized by forming the bumped substrate 200 in form bumped substrate including bump layer operation 102, reflowing the bumped substrate 200 in reflow bumped substrate operation 104, measuring the delta bow in measure delta bow operation 106, and determining whether the delta bow is acceptable in delta bow acceptable check operation 108.

If a determination is made that the optimization is not sufficient, i.e., a determination is made that the delta bow is not acceptable in delta bow acceptable check operation 108, the design is further optimized and characterized by repeating the above operations. This process is repeated until a determination is made that the optimization is sufficient, i.e., a determination is made that the delta bow is acceptable in delta bow acceptable check operation 108. The design of the final optimized bumped substrate 200 is then used to mass produce the bumped substrates 200.

For simplicity, a zero delta bow will be discussed below as an example of an acceptable delta bow post reflow, however, in light of this disclosure, those of skill in the art will understand that a slight delta bow may also be acceptable depending upon the application.

By producing bumped substrate 200 with a zero delta bow post reflow, device reliability is assured. More particularly, the transistor shift associated with warped substrates is avoided. Further, by producing flat bumped substrates, reliability in the flip chip interconnections formed with interconnection balls 322 is assured as compared to the open circuits associated with warped substrates.

As set forth above, the delta bow of bumped substrate 200 is measured post reflow. More particularly, the inventor has discovered that the greatest contribution to delta bow is the reflow operation, i.e., the change in stress of the various layers of bumped substrate 200 before and after reflow. Accordingly, bump layer 212 is formed such that bumped substrate 200 has zero bow post reflow.

In one embodiment, prior to performance of reflow bumped substrate operation 104, i.e., prior to reflow, bumped substrate 200 is curved. For example, bumped substrate 200 has a compressive bow such as that illustrate in FIG. 4 prior to reflow. After reflow, the changes in stress of the various layers of bumped substrate 200 cause bumped substrate 200 to have a zero bow such as that illustrated in FIG. 6.

In another example, bumped substrate 200 has a tensile bow such as that illustrate in FIG. 5 prior to reflow. After reflow, the changes in stress of the various layers of bumped substrate 200 causes bumped substrate 200 to have a zero bow such as that illustrated in FIG. 6.

Accordingly, in various embodiments, bump layer 212 is designed to have tensile or compressive stress as deposited resulting in a curved bumped substrate 200. However, during reflow, the change in stress of the various layers of bumped substrate 200 causes bumped substrate 200 to have a zero bow such as that illustrated in FIG. 6.

Although a particular bumped substrate 200 is described in detail in reference to FIGS. 2 and 3, in other embodiments, other bumped substrates are used. For example, referring to FIGS. 2 and 3, lower layer 216 is omitted, the thickness of middle layer 218/upper layer 220 is 5/3 μm, 3/3 μm, 2/3 μm, 2/2 μm although middle layer 218/upper layer 220 have other thicknesses in other embodiments. In another embodiment, both lower layer 216 and middle layer 218 are omitted, and the thickness of upper layer 220 is 2 μm or 3 μm although upper layer 220 has other thicknesses in other embodiments.

In yet another embodiment, lower layer 216 is formed of titanium copper (TiCu), middle layer 218 is 5 μm copper (Cu) and upper layer 220 is 2 μm nickel (Ni). In another embodiment, lower layer 216 is omitted, middle layer 218 is titanium copper (TiCu) and upper layer 220 is 2 μm nickel (Ni). In one embodiment, interconnection bump 214 is tin silver (SnAg) having a thickness of 3 μm and upper layer 220 is nickel (Ni) having a thickness of 1 μm for a combined thickness of interconnection bump 214 and upper layer 220 of 4 μm.

Figure 7:
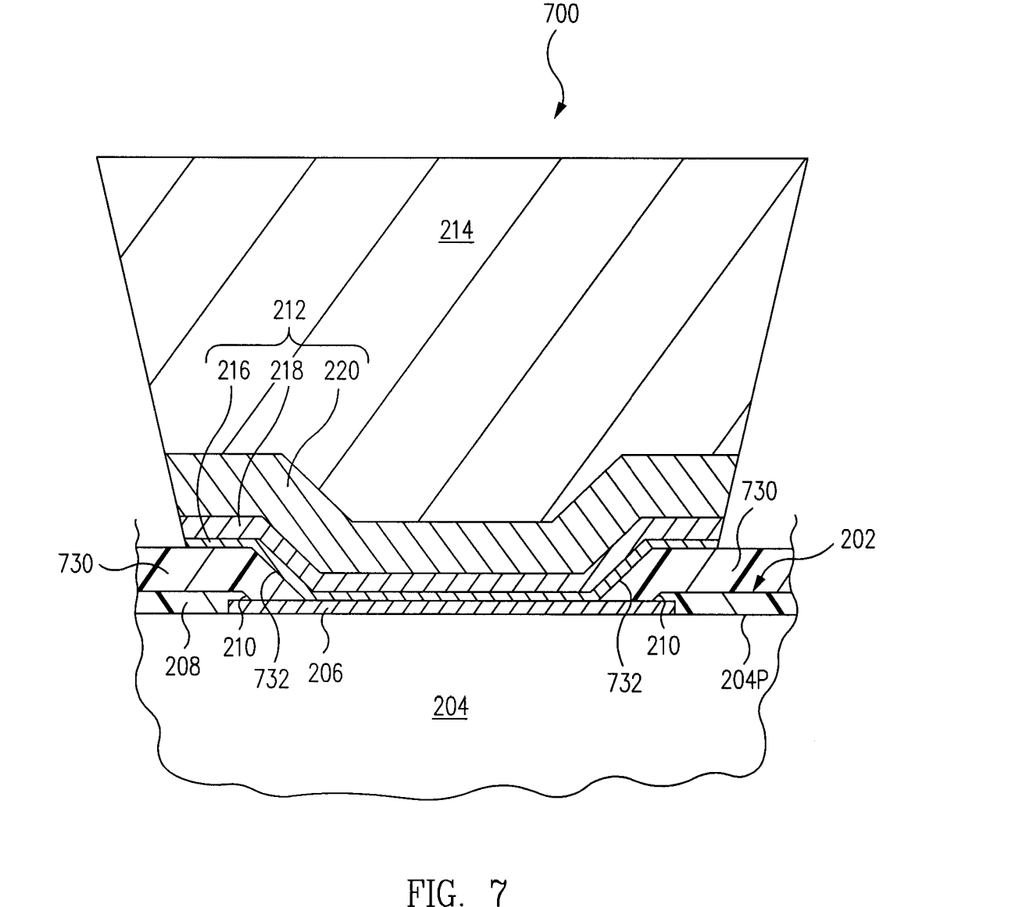
FIG. 7 is a cross-sectional view of a bumped substrate in accordance with another embodiment.

FIG. 7 is a cross-sectional view of a bumped substrate 700 in accordance with another embodiment. Bumped substrate 700 is substantially identical to bumped substrate 200 of FIG. 2 except that bumped substrate 700 includes a repassivation layer 730, e.g., a polyimide repassivation layer. Accordingly, only the significant differences between bumped substrate 200 of FIG. 2 and bumped substrate 700 of FIG. 7 are discussed below.

As illustrated in FIG. 7, repassivation layer 730 is formed on passivation layer 208 and extends into passivation layer opening 210 and on to a portion of bond pad 206 adjacent passivation layer opening 210. Bond pad 206 is exposed through a repassivation layer opening 732 of repassivation layer 730. Further, in accordance with this embodiment, lower layer 216 is formed directly on bond pad 206 and extends on to repassivation layer 730 around the periphery of repassivation layer opening 732.

Although specific embodiments were described herein, the scope of the invention is not limited to those specific embodiments. Numerous variations, whether explicitly given in the specification or not, such as differences in structure, dimension, and use of material, are possible. The scope of the invention is at least as broad as given by the following claims.

What is claimed is:

1. A method comprising:
reflowing a bumped substrate comprising a bump layer;
measuring a delta bow of the bumped substrate after the reflowing;
determining whether the measured delta bow is acceptable, and;
if it is determined that the measured delta bow is not acceptable, adjusting one or more formation parameters of one or more sublayers of the bump layer while keeping thicknesses of the one or more sublayers the same.

2. The method of claim 1, comprising, upon a determination that the measured delta bow is not acceptable, determining an adjustment to a bump layer design of the bump layer to reduce the delta bow after the reflowing.

3. The method of claim 2 wherein the delta bow is a compressive bow, and the adjustment comprises adjusting the bump layer to have less tensile stress after reflow.

4. The method of claim 2 wherein the delta bow is a compressive bow, and the adjustment comprises adjusting the bump layer to have a compressive stress after reflow.

5. The method of claim 2 wherein the delta bow is a tensile bow, and the adjustment comprises adjusting the bump layer to have less compressive stress after reflow.

6. The method of claim 2 wherein the delta bow is a tensile bow, and the adjustment comprises adjusting the bump layer to have a tensile stress after reflow.

7. The method of claim 1 wherein prior to the reflowing, the bumped substrate further comprises:
a bond pad; and
an interconnection bump, wherein the bump layer forms an interface between the bond pad and the interconnection bump.

8. The method of claim 7 wherein the bump layer comprises:
a lower layer directly coupled to the bond pad;
a middle layer directly coupled to the lower layer;
an upper layer directly coupled to the middle layer.

9. The method of claim 8 wherein the interconnection bump is directly coupled to the upper layer.

10. The method of claim 7 wherein the reflowing comprises reflowing the interconnection bump to form an interconnection ball.

11. The method of claim 1 wherein the delta bow is a curvature of the bumped substrate relative to a flat plane.

12. A method comprising:
reflowing a bumped substrate comprising a bump layer;
measuring a delta bow of the bumped substrate after the reflowing;
determining whether the measured delta bow is acceptable; and
if it is determined that the delta bow is not acceptable, then determining an adjustment to a design of the bump layer to change post-reflow stress characteristics of the bump layer by adjusting one or more formation parameters of one or more sublayers of the bump layer while keeping thicknesses of the one or more sublayers the same.

13. The method of claim 12, wherein the adjusting of the one or more formation parameters of one or more sublayers of the bump layer comprises adjusting one or more of: plating bath temperature, a plating rate, a plating bath metal content, a plating bath pH, and plating bath additive concentrations.

14. The method of claim 12, wherein the one or more sublayers comprise an adhesion layer, a current carrying layer, and a solder wettable layer.

15. The method of claim 12, wherein the adjustment to the design of the bump layer comprises adjusting the design of the bump layer to have different post-reflow tensile stress.

16. The method of claim 15, wherein the delta bow is a compressive bow and the adjustment to the design of the bump layer comprises adjusting the design of the bump layer to have less post-reflow tensile stress.

17. A method comprising:
a) reflowing a bumped substrate comprising a bump layer;
b) measuring a delta bow of the bumped substrate after the reflowing;
c) determining if the measured delta bow is acceptable;
d) if it is determined that the measured delta bow is not acceptable, then determining an adjustment to a design of the bump layer to change post-reflow stress characteristics of the bump layer by adjusting one or more formation parameters of one or more sublayers of the bump layer while keeping thicknesses of the one or more sublayers the same; and
e) repeating steps b, c, and d until it is determined that the measured delta bow is acceptable.

18. The method of claim 17, wherein the adjusting of the one or more formation parameters of one or more sublayers of the bump layer comprises adjusting one or more of: plating bath temperature, a plating rate, a plating bath metal content, a plating bath pH, and plating bath additive concentrations.

19. The method of claim 17, wherein the one or more sublayers comprise an adhesion layer, a current carrying layer, and a solder wettable layer.

20. The method of claim 17, wherein the adjustment to the design of the bump layer comprises adjusting the design of the bump layer to change post-reflow stress characteristics of the bump layer.

21. The method of claim 20, wherein the adjustment to the design of the bump layer comprises adjusting the design of the bump layer to have different post-reflow tensile stress.

22. The method of claim 21, wherein the delta bow is a compressive bow and the adjustment to the design of the bump layer comprises adjusting the design of the bump layer to have less post-reflow tensile stress.

* * * * *